(12) United States Patent
Park et al.

(10) Patent No.: US 7,511,595 B2
(45) Date of Patent: Mar. 31, 2009

(54) MULTI-BAND FILTER MODULE AND METHOD OF FABRICATING THE SAME

(75) Inventors: Yun-kwon Park, Dongducheon-si (KR); In-sang Song, Seoul (KR); Chul-soo Kim, Hwaseong-si (KR); Kuang-woo Nam, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 157 days.

(21) Appl. No.: 11/633,464

(22) Filed: Dec. 5, 2006

(65) Prior Publication Data
US 2007/0182510 A1    Aug. 9, 2007

(30) Foreign Application Priority Data
Feb. 6, 2006    (KR)    ....................... 10-2006-0011154

(51) Int. Cl.
*H03H 9/70* (2006.01)
*H03H 3/02* (2006.01)
(52) U.S. Cl. .................. 333/133; 333/132; 29/25.35
(58) Field of Classification Search .................. 333/133, 333/189, 193
See application file for complete search history.

(56) References Cited

U.S. PATENT DOCUMENTS

| 7,378,922 B2 * | 5/2008 | Kubo et al. ................. 333/189 |
|---|---|---|
| 2002/0109564 A1 * | 8/2002 | Tsai et al. .................... 333/187 |
| 2002/0121337 A1 * | 9/2002 | Whatmore et al. .......... 156/285 |
| 2005/0057323 A1 * | 3/2005 | Kando .......................... 333/141 |
| 2005/0218488 A1 * | 10/2005 | Matsuo ........................ 257/678 |
| 2006/0255443 A1 * | 11/2006 | Hwang et al. ............... 257/686 |
| 2007/0012655 A1 * | 1/2007 | Kwon et al. .................. 216/13 |

FOREIGN PATENT DOCUMENTS

| JP | 06-006170 | * | 1/1994 | ................. 333/193 |
| JP | 2000-049564 | * | 2/2000 |

OTHER PUBLICATIONS

Machine Translation of Ohara JP 2000-049564, Feb. 2000.*

* cited by examiner

*Primary Examiner*—Barbara Summons
(74) *Attorney, Agent, or Firm*—Sughrue Mion, PLLC

(57) ABSTRACT

A multi-band filter module and a method of fabricating the same are disclosed. At least one upper filter is deposited on an upper surface of a first substrate. The first packaging substrate packages the upper filter deposited on the first substrate. At least one lower filter is deposited on an upper surface of the second substrate. The second packaging substrate packages the lower filter deposited on the second substrate. The lower surface of the first substrate is joined to a lower surface of the second substrate to face each other.

20 Claims, 5 Drawing Sheets

MULTI-BAND FILTER MODULE AND METHOD OF FABRICATING THE SAME

CROSS-REFERENCE TO RELATED APPLICATION

This application claims priority under 35 U.S.C. § 119 from Korean Patent Application No. 10-2006-0011154, filed on Feb. 6, 2006, in the Korean Intellectual Property Office, the entire contents of which are incorporated herein by reference.

BACKGROUND OF THE INVENTION

1. Field of the Invention

Apparatuses and methods consistent with the invention relate to a multi-band filter module and fabricating the same, and more particularly, to a multi-band filter module that provides a multi-band function through at least two packaged filters, and fabricating the same.

2. Description of the Related Art

Global System for Mobile Communications (GSM) is a communication technology whereby persons can conveniently use mobile communication devices in many countries across the world, without requiring international roaming. The GSM has been widely spread around Europe.

The GSM is briefly divided into bands of GSM 850, GSM 900, GSM 1800, and GSM 1900. If two of the above-described bands are used in the system, it is called a dual band, and if three bands are used, it is called a triple band. If four bands are used, it is called a quad band. In order to implement a dual band function, the conventional mobile communication device should be provided with at least two transceiver filters. In order to implement a quad band function, the conventional mobile communication device should be provided with at least four transceiver filters.

FIG. 1 is a view schematically illustrating a quad band filter module used in a related art mobile communication device.

Referring to FIG. 1, a related art quad band filter module 100 includes four filters 111, 112, 113, and 114 arranged on a substrate 120 in a line. These filters on the substrate are packaged by an upper wafer 130 and a lower wafer 140. These filters 111 through 114 are communicable in the bands of GSM 850, GSM 900, GSM 1800, and GSM 1900, respectively.

In the related art filter module, however, four filters 111 through 114 are arranged on one substrate 120 in line, and thus the number of output pads 150_1, 150_2, ..., and 150_n (where, n is a constant) provided on the upper wafer 130 of the filter module 100 to connect the respective filters 111 through 114 with an external power is increased. For example, in the case where each of filters 111 through 114 is provided with six electrodes, 24 output pads (not shown) are provided on the upper wafer 130, while no output pad is provided on the lower wafer 140.

Accordingly, a coupling phenomenon occurs among the output pads closely arranged in the filter module 100, and this causes an inflow of an external noise or disturbance among the filters 111 through 114. Also, due to the coupling phenomenon, the related art filter module 100 cannot perform an accurate filtering by frequency bands, and thus a yield of the product is degraded.

SUMMARY OF THE INVENTION

The present invention has been developed in order to address the above drawbacks and other problems associated with the conventional arrangement of the filters in a multi-band filter module. An aspect of the present invention is to provide a multi-band filter module and a method of fabricating the same, which can reduce a coupling phenomenon and improve the yield of a device by distributing output pads closely arranged on one substrate.

Another aspect of the present invention is to provide a multi-band filter module and a method of fabricating the same, which can reduce the size of an integrated filter and increase convenience in manufacturing the filter to reduce its manufacturing cost.

The foregoing and other aspects are substantially realized by providing a multi-band filter module, according to the present invention, which includes a first substrate with at least one upper filter deposited on an upper surface of the first substrate, a first packaging substrate packaging the at least one upper filter deposited on the first substrate, a second substrate with at least one lower filter deposited on an upper surface of the second substrate, and a second packaging substrate packaging the at least one lower filter deposited on the second substrate. A lower surface of the first substrate is joined to a lower surface of the second substrate to face each other.

The first packaging substrate may include a first wafer joined to the first substrate through first and second sealing parts provided on both sides of the first substrate, and a second wafer deposited on the first wafer and having a plurality of pads electrically connected to the at least one upper filter and formed on an upper surface of the second wafer.

Preferably, but not necessarily, the second packaging substrate may include a third wafer joined to the second substrate through third and fourth sealing parts provided on both sides of the second substrate, and a fourth wafer deposited on the third wafer and having a plurality of pads electrically connected to the at least one lower filter and formed on an upper surface of the fourth wafer.

The at least one upper filter may include at least one of a first filter deposited on a first region of the first substrate to filter a frequency in a first frequency band, and a second filter deposited on a second region of the first substrate, being spaced apart from the first filter for a predetermined distance, to filter a frequency in a second frequency band.

The at least one lower filter may include at least one of a third filter deposited on the second substrate to filter a frequency in a third frequency band, and a fourth filter deposited on the second substrate, being spaced apart from the third filter for a predetermined distance, to filter a frequency in a fourth frequency band.

The at least one upper filter or the at least one lower filter may include at least one different filter among a global system for mobile communications (GSM) 850 band filter, a GSM 900 band filter, a GSM 1800 band filter, and a GSM 1900 band filter, to perform a multi-band filtering.

At least one of the upper and lower filters may be made by integrating the at least two different band filters on a same substrate.

The at least one upper filter or the at least one lower filter is a film bulk acoustic resonator (FBAR).

The at least one upper filter or the at least one lower filter may include cavities formed on predetermined regions of the first and second substrates, being spaced part from each other, lower electrodes positioned on the first and second substrates to cover the cavities, a piezoelectric layer positioned on the lower electrode, and an upper electrode positioned on the piezoelectric layer.

The first substrate or the second substrate may include at least one cavity, and the at least one cavity formed on the first substrate is joined to the at least one cavity formed on the second substrate to face each other.

In another aspect of the present invention, there is provided a method of fabricating a multi-band filter module, which includes (a) depositing at least one upper filter on an upper surface of the first substrate, (b) packaging the at least one upper filter deposited on the first substrate, (c) depositing at least one lower filter on an upper surface of the second substrate, (d) packaging the at least one lower filter deposited on the second substrate, and (e) joining a lower surface of the first substrate to a lower surface of the second substrate to face each other.

In operation (a), each of the at least one upper filter may be deposited on a different region of the first substrate, the at least one upper filter being spaced apart from each other for a predetermined distance, and operation (b) includes (b1) providing a first wafer and depositing on the first wafer a second wafer having a plurality of pads formed on an upper surface of the second wafer and electrically connected to the at least one upper filter, and (b2) joining the first substrate to the first wafer through first and second sealing parts provided on both sides of the first substrate.

In operation (c), each of the at least one lower filter may be deposited on a different region of the second substrate, the at least one lower filter being spaced apart from each other for a predetermined distance, and the step (d) includes (d1) providing a third wafer and depositing on a third wafer a fourth wafer having a plurality of pads formed on an upper surface of the fourth wafer and electrically connected to the at least one lower filter, and (d2) joining the second substrate to the third wafer through third and fourth sealing parts provided on both sides of the second substrate.

BRIEF DESCRIPTION OF THE DRAWINGS

The above aspects and features of the present invention will be more apparent by describing certain embodiments of the present invention with reference to the accompanying drawings, in which.

DETAILED DESCRIPTION OF EXEMPLARY EMBODIMENTS

Figure 1:
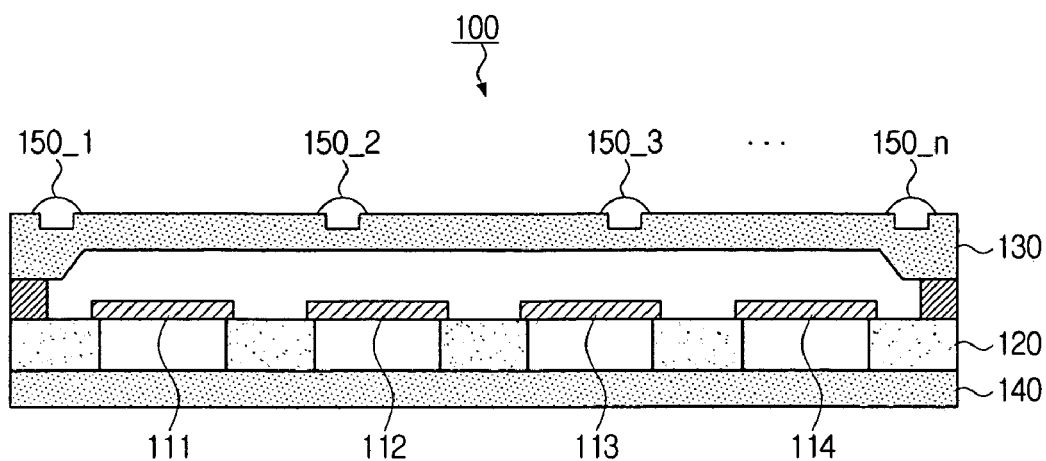
FIG. 1 is a view schematically illustrating a quad band filter module used in a related art mobile communication device.

Certain exemplary embodiments of the present invention will be described in greater detail with reference to the accompanying drawings.

In the following description, the same drawing reference numerals are used for the same elements even in different drawings. The matters defined in the description such as a detailed construction and elements are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

Figure 2:
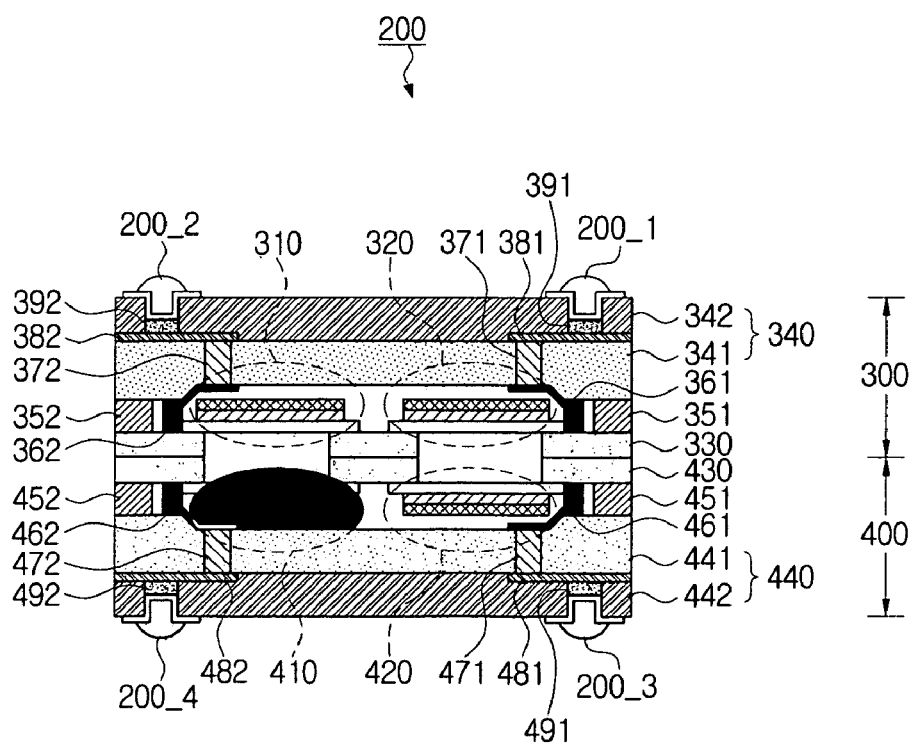
FIG. 2 is a vertical longitudinal sectional view schematically illustrating a filter module having a multi-band function according to an exemplary embodiment of the present invention.
Figure 3A:
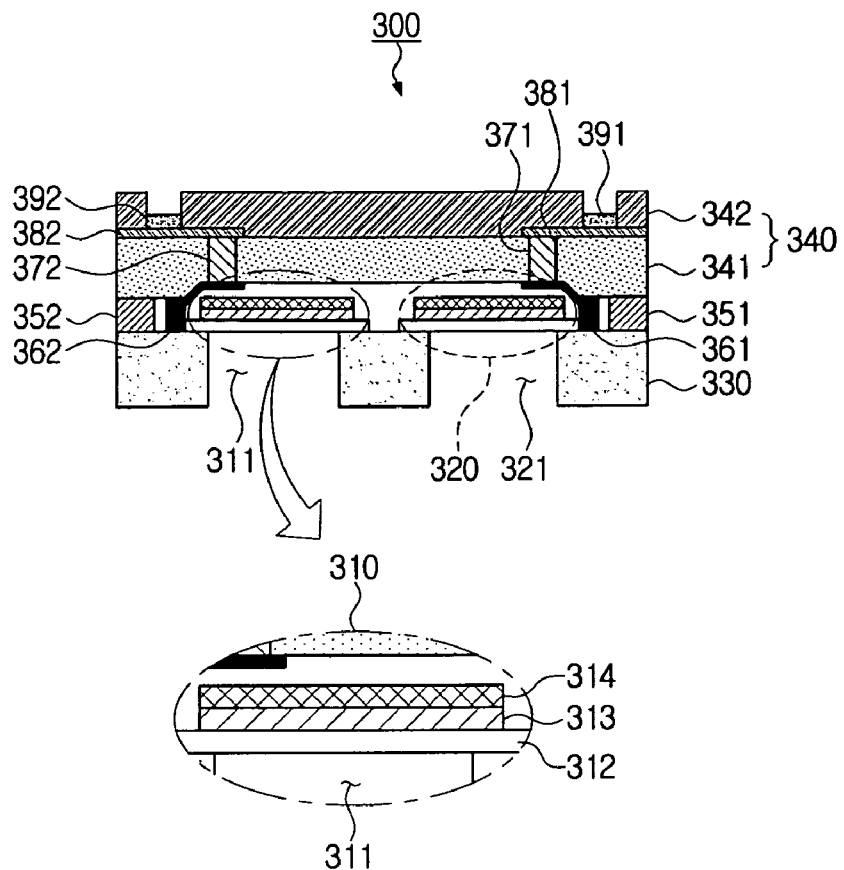
FIGS. 3A and 3B are vertical longitudinal sectional views illustrating the first filter module and the second filter module shown in FIG. 2 according to an exemplary embodiment of the present invention.
Figure 3B:
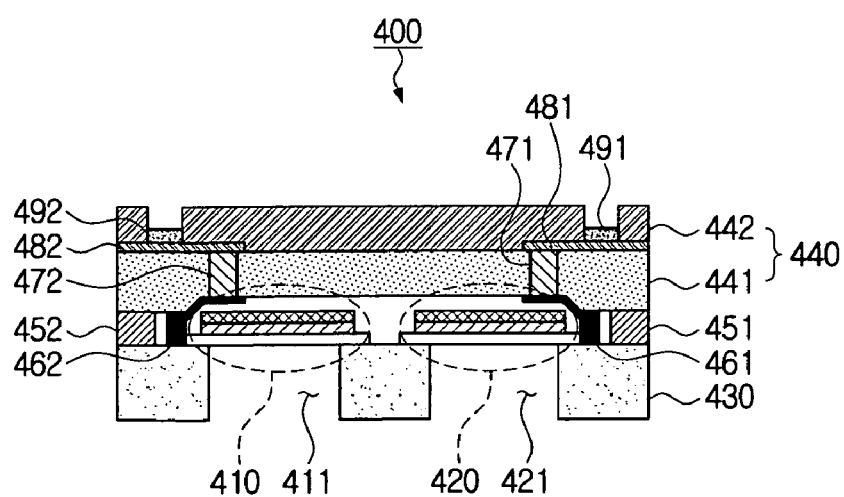

FIG. 2 is a vertical longitudinal sectional view schematically illustrating a filter module having a multi-band function according to an exemplary embodiment of the present invention. FIGS. 3A and 3B are vertical longitudinal sectional view illustrating the first filter module and the second filter module shown in FIG. 2.

Referring to FIG. 2, the filter module 200 according to an exemplary embodiment of the present invention includes a first filter module 300, a second filter module 400, and first to n-th pads 200_1, 200_2, . . . , and 200_n (where, n is a constant).

The filter module 200 is mounted on a mobile communication device to provide the device with the multi-band function by use of at least two filters. In this exemplary embodiment, a quad band function using four filters will be described hereinafter. Four filters used in an exemplary embodiment of the present invention are a GSM 850 band filter, a GSM 900 band filter, a GSM 1800 band filter, and a GSM 1900 band filter. The frequency range of each band is as follows.

The GSM 850 band is in the range of 824 to 894 MHz, the GSM 900 band is in the range of 880 to 960 MHz, the GSM 1800 band is in the range of 1710 to 1880 MHz, and the GSM 1900 band is in the range of 1850 to 1990 MHz.

In the case of providing a dual band function, two filters corresponding to two bands among four GSM bands may be used.

Four filters used in the exemplary embodiment of the present invention are integrated in the filter module 200 according to SOC (System-On-Chip) and SIP (System-In-Package) technologies. For example, at least one of an upper filter and a lower filter is made by integrating at least two different band filters onto the same substrate, and the upper filter and the lower filter are integrally packaged, which will be described hereinafter.

Referring to FIG. 3A, the first filter module 300 includes a first filter 310, a second filter 320, a first substrate 330, a first packaging substrate 340, a first sealing part 351, a second sealing part 352, a first metal 361, and a second metal 362.

The first filter module 300 is configured such that the first filter 310 and the second filter 320 as the upper filter are formed between the first substrate 330 and the first packaging substrate 340, thereby providing the dual band function.

To this end, the first filter module 300 employs the first filter 310 and the second filter 320 to filter a similar frequency band. That is, the first filter 310 filters a frequency in a first frequency band, and the second filter 320 filters a frequency in a second frequency band. For example, the first filter 310 filters a frequency in the GSM 850 band, and the second filter 320 filters a frequency in the GSM 900 band.

The first filter 310 and the second filter 320 are implemented by a film bulk acoustic resonator (hereinafter referred to as 'FBAR'). The FBAR may be mass produced at the minimum cost, and may be easily thinned and lightened. Also, the first filter 310 and the second filter 320 are implemented by the first filter module 300 through the SOC technology. The SOC technology is to integrate devices having diverse functions as one chip, thereby shortening a time required to transmit data between devices and improving its reliability.

The first filter 310 implemented by the FBAR includes a first cavity 311, a lower electrode 312, a piezoelectric layer 313, and an upper electrode 314. The first cavity 311 is formed by wet or dry etching the first substrate 330, and may be implemented by an air gap type FBAR. The lower electrode 312 is positioned on a first desired region of the upper surface of the first substrate 330 to cover the first cavity 311. The piezoelectric layer 313 is positioned on the upper surface of the lower electrode 312, and the upper electrode 314 is positioned on the piezoelectric layer 313.

The lower electrode 312 and the upper electrode 314 are made of conductive material such as metal, and aluminum nitride (AlN) or zinc oxide (ZnO) is used as a typical piezoelectric material, but the present invention is not limited thereto. Any one of sputtering and evaporation may be used as a deposition method. As such, if the lower electrode 312 and the upper electrode 314 are connected to a power source, the piezoelectric layer 313 generates a piezoelectric phenomenon to resonate due to acoustic waves between the upper and lower electrodes.

The second filter 320 has an architecture similar to that of the first filter 310, and its detailed description will be omitted herein. However, the second filter 320 is spaced apart from the first filter 310 for a predetermined distance, and is positioned on the second desired region of the first substrate 330. The lower electrode of the second filter 320 is deposited to cover a second cavity 321.

The first packaging substrate 340 has a first wafer 341 and a second wafer 342. The first wafer 341 is adhered to both sides of the first substrate 330, i.e., the first sealing part 351 and the second sealing part 352 provided on each side of the first filter 310 and the second filter 320. The second wafer 342 is deposited on the first wafer 341, and has a plurality of pads 200_1, 200_2, . . . , and 200_n electrically connecting the first filter 310 and the second filter 320 with the external power source.

The first metal 361, the second metal 362, a first connecting electrode 371, a second connecting electrode 372, a first coupling electrode 381, a second coupling electrode 382, a first pad electrode 391, and a second pad electrode 392 serve as an electric path between a plurality of the pads 200_1, 200_2, and so forth, the first filter 310, and the second filter 320. To this end, the first metal 361 and the second metal 362 may be mainly composed of Au or AuSn.

The second filter module 400 shown in FIG. 3B is configured such that the third filter 410 and the fourth filter 420 as the lower filter are formed between the second substrate 430 and the second packaging substrate 440, thereby providing the dual band function. To this end, the second filter module 400 employs the third filter 410 and the fourth filter 420 to filter a similar frequency band. That is, the third filter 410 filters a frequency in a third frequency band, and the fourth filter 420 filters a frequency in a fourth frequency band. For example, the third filter 410 filters a frequency in the GSM 1800 band, and the fourth filter 420 filters a frequency in the GSM 1900 band.

The third filter 410 and the fourth filter 420 are implemented by the FBAR. The third filter 410 and the fourth filter 420 are implemented by the second filter module 400 through the SOC technology. The third filter 410 and the fourth filter 420 are made by the method similar to that of forming the first filter 310 and the second filter 320, the description of which will not be repeated herein. However, a third metal 461, a fourth metal 462, a third piercing electrode 471, a fourth piercing electrode 472, a third coupling electrode 481, a fourth coupling electrode 482, a third pad electrode 491, and a fourth pad electrode 492 serve as an electric path between a plurality of pads 200_3, 200_4, and so forth provided on the fourth wafer 442, the third filter 410, and the fourth filter 420.

The first filter module 300 and the second filter module 400 are adhered to each other through the SIP technology. The SIP technology is to perform a surface mount of a plurality of chips as one package, which shortens a design period and is adapted to miniaturization of the device.

The first through n-th pads 200_1 through 200_n are provided to connect the first through fourth filters 310, 320, 410, 420 with the external power source, and may be implemented in a ball bump type. A wire is bonded onto the first through n-th pads 200_1 through 200_n. The first through n-th pads 200_1 through 200_n are provided on the upper surface of the second wafer 342 and fourth wafer 442, as shown in FIG. 2.

Figure 4A:
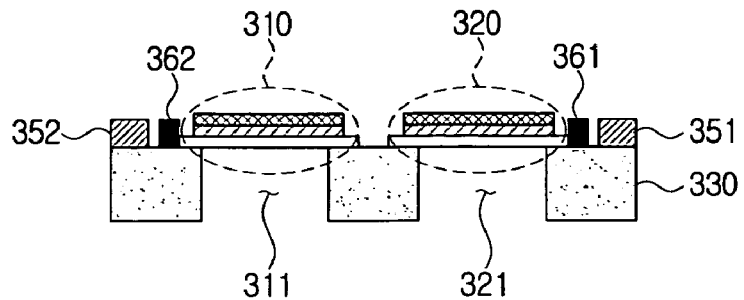
FIGS. 4A through 4C are vertical longitudinal sectional views explaining a process of fabricating the first filter module shown in FIG. 2 according to an exemplary embodiment of the present invention.
Figure 4B:
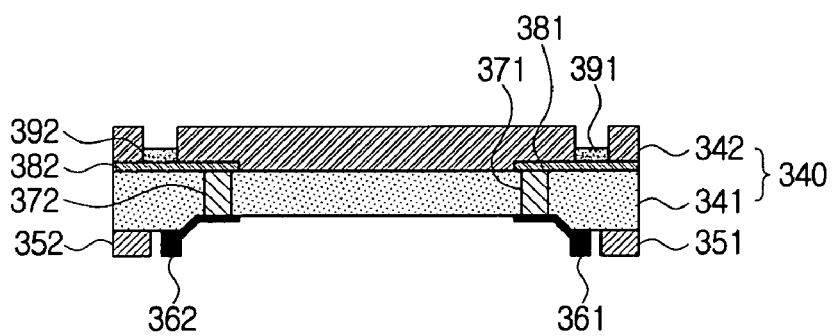
Figure 4C:
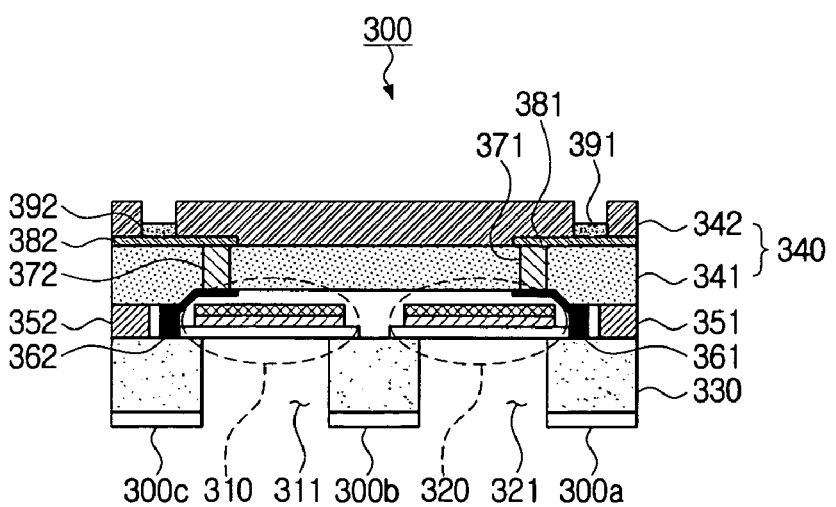

FIGS. 4A through 4C are vertical longitudinal sectional views explaining a process of fabricating the first filter module shown in FIG. 2.

First, as shown in FIG. 4A, the first filter 310 filtering the frequency in the first frequency band is deposited on the first substrate 330. In this instance, the first filter 310 has the first cavity 311 formed on the first substrate 330. The second filter 320 is spaced apart from the first filter 310 for a predetermined distance, and is deposited on the first substrate 330. The second filter 320 has the second cavity 312. The first sealing part 351, the second sealing part 352, the first metal 361, and the second metal 362 are adhered to both sides of the first substrate 330.

Next, as shown in FIG. 4B, the second wafer 342 is deposited on the first wafer 341, and the first and second pads 200_1 and 200_2 electrically connected to the first filter 310 and the second filter 320 are provided on the upper surface of the second wafer 342. The first sealing part 351, the second sealing part 352, the first metal 361, and the second metal 362 are adhered to the bottom surface of the first wafer 341. The first piercing electrode 371, the second piercing electrode 372, the first coupling electrode 381, the second coupling electrode 382, the first pad electrode 391, and the second pad electrode 392 are formed on the first wafer 341 and the second wafer 342.

Referring to FIG. 4C, the first sealing part 351, the second sealing part 352, the first metal 361, and the second meal 362 provided on the bottom surface of the first substrate 330, as shown in FIG. 4A, are respectively joined to the first sealing part 351, the second sealing part 352, the first metal 361, and the second meal 362 provided on the bottom surface of the first wafer 341, as shown in FIG. 4B, which fabricates the first filter module 300.

Figure 5A:
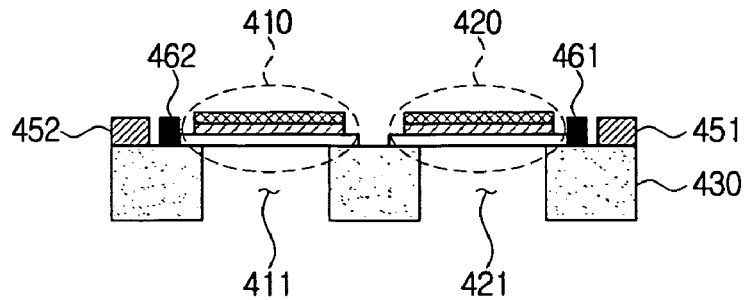
FIGS. 5A through 5C are vertical longitudinal sectional views explaining a process of fabricating the second filter module shown in FIG. 2 according to an exemplary embodiment of the present invention.
Figure 5B:
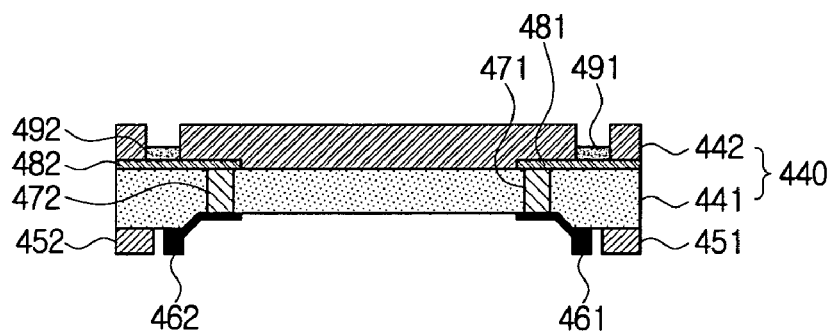
Figure 5C:
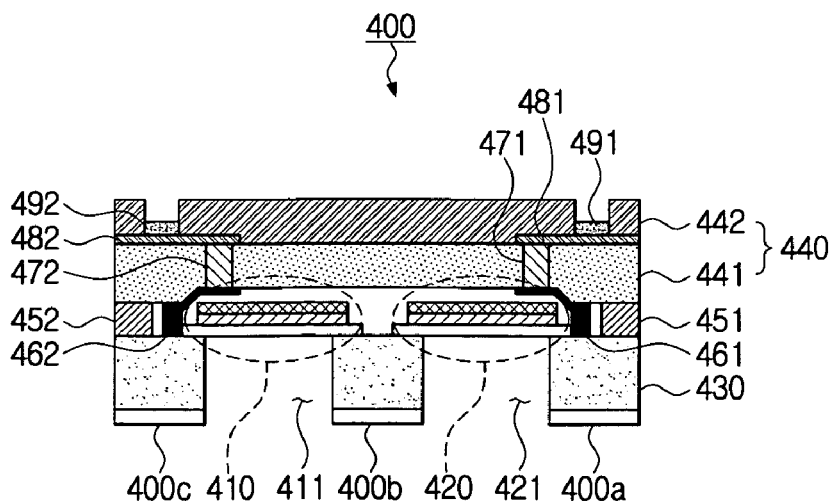

FIGS. 5A through 5C are vertical longitudinal sectional views explaining a process of fabricating the second filter module shown in FIG. 2.

First, as shown in FIG. 5A, the third filter 410 filtering the frequency in the third frequency band is deposited on the second substrate 430. In this instance, the third filter 410 has the third cavity 411 formed on the second substrate 430. The fourth filter 420 is spaced apart from the third filter 410 for a predetermined distance, and is deposited on the second substrate 430. The fourth filter 420 has the fourth cavity 412. The third sealing part 451, the fourth sealing part 452, the third metal 41, and the fourth metal 462 are adhered to both sides of the second substrate 430.

Next, as shown in FIG. 5B, the third wafer 442 is deposited on the third wafer 441, and the third and n-th pads 200_3 and 200_n electrically connected to the third filter 410 and the fourth filter 420 are provided on the upper surface of the fourth wafer 442. The third sealing part 451, the fourth sealing part 452, the third metal 461, and the fourth metal 462 are adhered to the bottom surface of the third wafer 441. The third piercing electrode 471, the fourth piercing electrode 472, the third coupling electrode 481, the fourth coupling electrode 482, the third pad electrode 491, and the fourth pad electrode 492 are formed on the third wafer 441 and the fourth wafer 442.

Referring to FIG. 5C, the third sealing part 451, the fourth sealing part 452, the third metal 461, and the fourth metal 462 provided on the bottom surface of the second substrate 430, as shown in FIG. 5A, are respectively joined to the third sealing part 451, the fourth sealing part 452, the third metal 461, and the fourth metal 462 provided on the bottom surface of the third wafer 441, as shown in FIG. 5B, which fabricates the second filter module 400.

Reference numeral 300a, 300b, 300c, 400a, 400b, and 400c are coupling elements each formed on the bottom surface of the first substrate 330 and the bottom surface of the second substrate 430 to join the first filter module 300 to the second filter module 400, and may be made of metal. The coupling elements 300a, 300b, 300c, 400a, 400b, and 400c are preferably formed after the first filter module 300 and the second filter module 400 are completed, but the present invention is not limited thereto.

Figure 6:
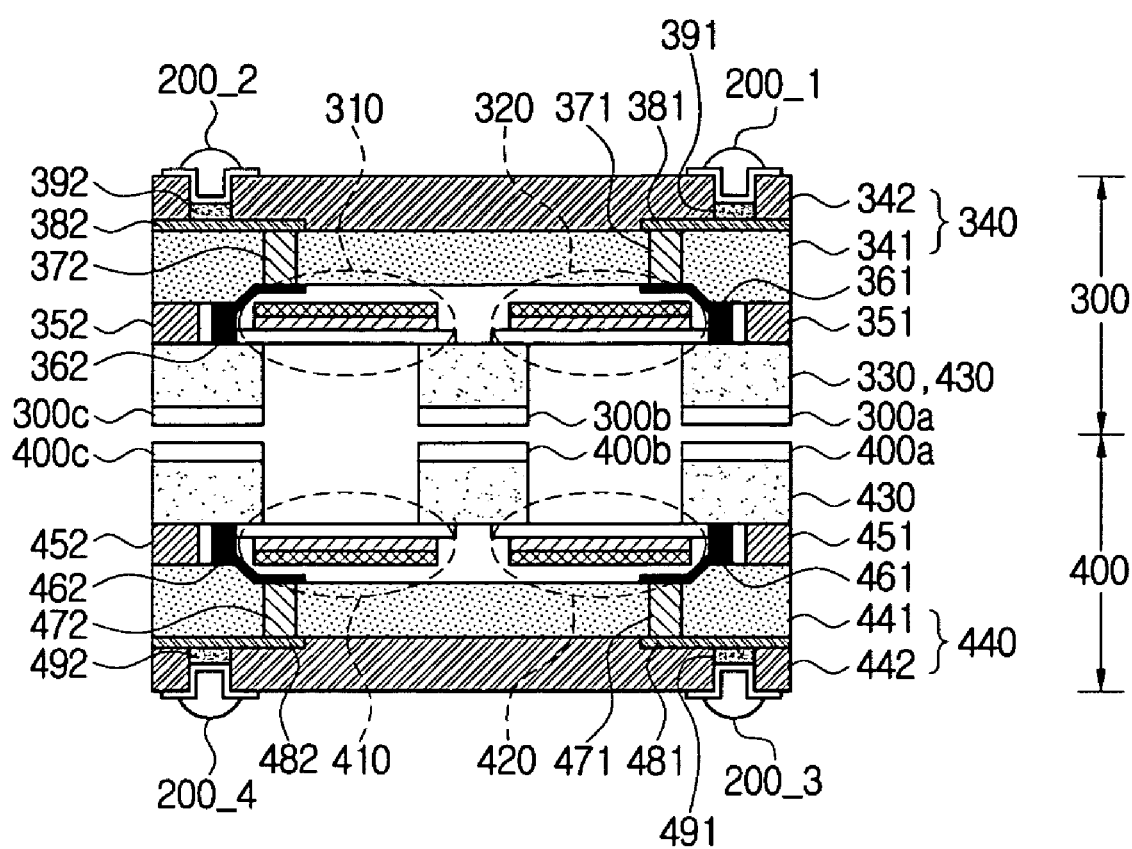
FIG. 6 is a view explaining a process of joining a first filter module to a second filter module according to an exemplary embodiment of the present invention.

If the second filter module 400 is made, as shown in FIG. 6, after the first through n-th pads 200_1, 200_2, . . . , and 200_n are formed on the upper end of the second wafer 342 and the upper end of the fourth wafer 442, the first through n-th pads 200_1, 200_2, . . . , and 200_n are connected to the first through fourth filters 310, 320, 410, and 420 through wire bonding. For example, the power is transferred to the first filter 310 via the first pad 100_1 and the first packaging substrate 340. When the first filter module 300 and the second filter module 400 are packaged, the first substrate 330 and the second substrate 430 are jointed in such a way that the bottom surface of the first substrate 330 is opposite to the bottom surface of the second substrate 430. As such, the filter module supporting the GSM standards is completely fabricated.

Meanwhile, the present invention can be applied not only to a receiver of a mobile communication device using the GSM but also to a receiver of a mobile communication device using a universal mobile telecommunications system (UMTS). The UMTS is to transmit and receive data through the GSM and Wideband Code Division Multiple Access (WCDMA), and can transmit and receive a sound signal and a moving picture signal with high performance.

In the exemplary embodiment of the present invention, the quad band function is provided using the first through fourth filters 310, 320, 410, and 420 adapted as the GSM 850, GSM 900, GSM 1800, and GSM 1900 band filters, respectively. However, this is exemplary, and the present invention can also be applied as a dual band or a triple band filtering two bands or three bands among the GSM 850, GSM 900, GSM 1800, GSM 1900 bands.

With the above description, according to the multi-band filter module and the method of fabricating the same, the filter module uses at least two filters so as to perform the multi-band filtering. In this instance, since at least two filters are packaged through the SIP technology, the number of wafers to be used in the process is reduced, the size is cut down, and a fabricating cost is reduced, as compared with that of the prior art.

Since the pads connecting each filter with the external electrode are dispensed on the upper surface and the lower surface of the filter module, the number of pads is reduced, thereby reducing a coupling phenomenon and thus increasing a yield.

Also, since each pad is provided on the upper and lower surface of the filter module, the process may be conveniently performed.

Since the quad band filter module is fabricated by the SOC technology and the SIP technology, the process time is shortened, and the apparatus is easily miniaturized.

In particular, at least two filters filtering similar frequency bands are integrated by the SOC technology, thereby improving a performance of the filter module and simplifying the process.

The foregoing embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A multi-band filter module comprising:
   a first substrate with at least one upper filter deposited on an upper surface of the first substrate;
   a first packaging substrate packaging the at least one upper filter deposited on the first substrate;
   a second substrate with at least one lower filter deposited on an upper surface of the second substrate; and
   a second packaging substrate packaging the at least one lower filter deposited on the second substrate;
   wherein a lower surface of the first substrate is joined to a lower surface of the second substrate to face each other, and
   wherein the at least one upper filter or the at least one lower filter is made by integrating at least two different frequency band filters on a same substrate which is the first substrate or the second substrate.

2. The multi-band filter module of claim 1, wherein the first packaging substrate comprises:
   a first wafer joined to the first substrate through first and second sealing parts provided on both sides of the first substrate; and
   a second wafer deposited on the first wafer and comprising a plurality of pads electrically connected to the at least one upper filter and formed on an upper surface of the second wafer.

3. The multi-band filter module of claim 2, wherein the second packaging substrate comprises:
   a third wafer joined to the second substrate through third and fourth sealing parts provided on both sides of the second substrate; and
   a fourth wafer deposited on the third wafer and comprising a plurality of pads electrically connected to the at least one lower filter and formed on an upper surface of the fourth wafer.

4. The multi-band filter module of claim 1, wherein the at least one upper filter comprises at least one of:
   a first filter deposited on a first region of the first substrate to filter a frequency in a first frequency band; and
   a second filter deposited on a second region of the first substrate, being spaced apart from the first filter for a predetermined distance, to filter a frequency in a second frequency band.

5. The multi-band filter module of claim 4, wherein the at least one lower filter comprises at least one of:

a third filter deposited on the second substrate to filter a frequency in a third frequency band; and a fourth filter deposited on the second substrate, being spaced apart from the third filter for a predetermined distance, to filter a frequency in a fourth frequency band.

6. The multi-band filter module of claim 5, wherein each of the first, second, third and fourth filters comprises a frequency band filter filtering a different frequency band from the other filters, and wherein the frequency band of the second filter is more similar to the frequency band of the first filter than the frequency band of the third or fourth filter, and the frequency band of the third filter is more similar to the frequency band of the fourth filter than the frequency band of the first or second filter.

7. The multi-band module of claim 5, wherein each of the first, second, third and fourth filters comprises:

first, second, third and fourth cavities, respectively, wherein the first and second cavities are formed on first and second predetermined regions of the first substrate, respectively, and the third and fourth cavities are formed on third and fourth predetermined regions of the second substrate, respectively;

first, second, third and fourth lower electrodes, respectively, wherein the first and second lower electrodes are positioned on the first substrate to cover the first and second cavities, respectively, and the third and fourth lower electrodes are positioned on the second substrate to cover the third and fourth cavities, respectively;

first, second, third and fourth piezoelectric layers positioned on the first, second, third and fourth lower electrodes, respectively; and first, second, third and fourth upper electrodes positioned on the first, second, third and fourth piezoelectric layers, respectively.

8. The multi-band module of claim 7, wherein the first cavity is joined to the third cavity, and the second cavity is joined to the fourth cavity.

9. The multi-band filter module of claim 1, wherein the at least one upper filter or the at least one lower filter comprises one of a global system for mobile communications (GSM) 850 band filter, a GSM 900 band filter, a GSM 1800 band filter, and a GSM 1900 band filter, to perform a multi-band filtering.

10. The multi-band filter module of claim 1, wherein the at least two different band filters are selected from a GSM 850 band filter, a GSM 900 band filter, a GSM 1800 band filter, and a GSM 1900 band filter.

11. A multi-band filter module comprising:

a first substrate with at least one upper filter deposited on an upper surface of the first substrate;

a first packaging substrate packaging the at least one upper filter deposited on the first substrate;

a second substrate with at least one lower filter deposited on an upper surface of the second substrate; and a second packaging substrate packaging the at least one lower filter deposited on the second substrate;

wherein a lower surface of the first substrate is joined to a lower surface of the second substrate to face each other, and wherein the at least one upper filter or the at least one lower filter is a film bulk acoustic resonator (FBAR).

12. The multi-band filter module of claim 11, wherein the at least one upper filter comprises:

a cavity formed on a predetermined region of the first substrate;

a lower electrode positioned on the first substrate to cover the cavity;

a piezoelectric layer positioned on the lower electrode; and an upper electrode positioned on the piezoelectric layer.

13. The multi-band filter module of claim 12, wherein the at least one lower filter comprises:

a cavity formed on a predetermined region of the second substrate;

a lower electrode positioned on the second substrate to cover the cavity;

a piezoelectric layer positioned on the lower electrode; and an upper electrode positioned on the piezoelectric layer.

14. The multi-band filter module of claim 13, wherein the cavity formed on the predetermined region of the first substrate is joined to the cavity formed on the predetermined region of the second substrate.

15. A method of fabricating a multi-band filter module, the method comprising:

(a) depositing at least one upper filter on an upper surface of a first substrate;

(b) packaging the at least one upper filter deposited on the first substrate;

(c) depositing at least one lower filter on an upper surface of a second substrate;

(d) packaging the at least one lower filter deposited on the second substrate; and (e) joining a lower surface of the first substrate to a lower surface of the second substrate to face each other, wherein the at least one upper filter or the at least one lower filter is made by integrating the at least two different frequency band filters on a same substrate which is the first substrate or the second substrate.

16. The method of claim 15, wherein the at least two different band filters are selected from a GSM 850 band filter, a GSM 900 band filter, a GSM 1800 band filter, and a GSM 1900 band filter.

17. The method of claim 15, wherein in operation (a), if the at least one upper filter includes two or more filters, each of the two or more upper filters is deposited on a different region of the first substrate, the at least one upper filter being spaced apart from each other for a predetermined distance, and operation (b) comprises:

(b1) providing a first wafer and depositing on the first wafer a second wafer comprising a plurality of pads formed on an upper surface of the second wafer and electrically connected to the at least one upper filter, and (b2) joining the first wafer to the first substrate through first and second sealing parts provided on both sides of the first substrate.

18. The method of claim 17, wherein in operation (c), if the at least one lower filter includes two or more filters, each of the two or more lower filters is deposited on a different region of the second substrate, the at least one lower filter being spaced apart from each other for a predetermined distance, and the step (d) comprises:

(d1) providing a third wafer and depositing on the third wafer a fourth wafer comprising a plurality of pads formed on an upper surface of the fourth wafer and electrically connected to the at least one lower filter; and (d2) joining the second substrate to the third wafer through third and fourth sealing parts provided on both sides of the second substrate.

19. The method of claim 15, wherein the at least one upper filter or the at least one lower filter is a film bulk acoustic resonator (FBAR).

20. The method of claim 15, wherein the at least one upper filter or the at least one lower filter comprises one of a GSM 850 band filter, a GSM 900 band filter, a GSM 1800 band filter, and a GSM 1900 band filter, to perform a multi-band filtering.

* * * * *